(12) United States Patent
Chua (10) Patent No.: US 7,019,959 B2
(45) Date of Patent: Mar. 28, 2006

(54) METHOD FOR FORMING A PRINTED CIRCUIT BOARD AND A PRINTED CIRCUIT BOARD FORMED THEREBY

(75) Inventor: Ah Lim Chua, Singapore (SG)

(73) Assignee: Gul Technologies Singapore Ltd, (SG)

( * ) Notice: Subject to any disclaimer, the term of this patent is extended or adjusted under 35 U.S.C. 154(b) by 0 days.

(21) Appl. No.: 10/475,267

(22) PCT Filed: Mar. 28, 2002

(86) PCT No.: PCT/SG02/00050

§ 371 (c)(1),
(2), (4) Date: Oct. 20, 2003

(87) PCT Pub. No.: WO02/087294

PCT Pub. Date: Oct. 31, 2002

(65) Prior Publication Data

US 2004/0124493 A1   Jul. 1, 2004

(30) Foreign Application Priority Data

Apr. 19, 2001   (SG) ............................ 200102200

(51) Int. Cl.
*H01G 4/005* (2006.01)
*H01G 9/00* (2006.01)

(52) U.S. Cl. ...................... 361/329; 361/330; 361/303; 361/763

(58) Field of Classification Search ............... 361/782, 361/328–330, 760–766, 303–304, 306.1, 361/306.2, 306.3, 312–313, 323–326; 174/260
See application file for complete search history.

(56) References Cited

U.S. PATENT DOCUMENTS

| 3,593,107 | A  | * | 7/1971 | Chilton et al. ............... 363/61 |
| 4,413,252 | A  | * | 11/1983 | Tyler et al. .................. 341/33 |
| 4,424,552 | A  | * | 1/1984 | Saint Marcoux ......... 361/301.4 |
| 5,155,655 | A  | * | 10/1992 | Howard et al. ............. 361/303 |
| 6,739,027 | B1 | * | 5/2004 | Lauffer et al. ............ 29/25.42 |
| 2002/0113287 | A1 | * | 8/2002 | Lee et al. ................... 257/503 |

FOREIGN PATENT DOCUMENTS

JP   2000-58765   * 2/2000

* cited by examiner

*Primary Examiner*—Eric W. Thomas
(74) *Attorney, Agent, or Firm*—Lawrence Y. D. Ho & Associates (57) ABSTRACT

Upper, inner and lower sections (182, 180 and 184) of a PCB (100) are formed with each section having a substrate (140, 150 and 160) having patterned layers of metallization (105 and 110, 115 and 120, and 125 and 130), respectively. Some of the patterned layers of metallization (110, 115, 120, and 125) have thicker portions (171, 173) and part (188) of portion (186), and thinner portions (172, 174, 187, 190, 191, 192 and 193). The resultant thinner portion (175 and 194) in the prepreg layers (145 and 155) with the respective thicker portions of metallization provide decoupling capacitors, while the resultant thicker portions (196 and 198), for example, provide a lower capacitance for improved trace impedance for the signal traces (191 and 192).

12 Claims, 13 Drawing Sheets

METHOD FOR FORMING A PRINTED CIRCUIT BOARD AND A PRINTED CIRCUIT BOARD FORMED THEREBY

FIELD OF THE INVENTION

The present invention relates to a printed circuit board which reduces electromagnetic interference, and more particularly to a printed circuit board incorporating distributed capacitance therein.

BACKGROUND OF THE INVENTION

Printed circuit boards (PCBS) are commonly used to provide a mechanical structure on which discrete electronic components, such as integrated circuits, resistors, capacitors and the like, are mounted and interconnected. The interconnections in a PCB are provided by layers of patterned traces of metal, typically copper, on and in the PCB. To meet more compact requirements, multi-layered PCBS with multiple layers of patterned metal traces are used. Such PCBS comprise alternate layers of insulation and patterned metal traces, with interconnections between the patterned metal traces through the layers of insulation by vertical vias or plated through holes. Typically, in a four layer PCB i.e. one having four patterned layers of metal traces, the two inner most layers provide a common electrical power plane and a common electrical ground plane, respectively, for all the circuitry on the PCB.

The operation of circuitry on a multi-layered PCB, especially where there signals at high frequencies of around 50 megahertz or more, causes voltage fluctuations between the power and ground planes. Such fluctuations, often referred to as electromagnetic interference (EMI) or noise, is undesirable. The common ground and common power planes in a multi-layered PCB have a capacitance value which helps to reduce EMI, however for most applications a larger capacitance is required to further reduce the EMI to meet EMI standards set by state regulatory bodies.

A method of controlling EMI is to decouple the power and ground planes by inserting discrete capacitors at various locations on a PCB, particularly at locations where the power and ground planes couple to power input terminals of an integrated circuit mounted on the PCB. A disadvantage of this method is that discrete capacitors consume scarce real estate on the PCB, and in addition, at high frequencies, discrete capacitors become less efficient in providing effective decoupling.

Another relatively new method of controlling EMI is disclosed in U.S. Pat. No. 5,079,069 assigned to Zycon Corporation, which provides a capacitive PCB that includes a capacitor laminate having a high capacitance value between the power and ground planes. The capacitor laminate extends through out the PCB, including locations with signal traces. The high capacitance of the capacitor laminate provides effective decoupling of EMI, however, a disadvantage of this method is that the high capacitance value of the capacitor laminate reduces the trace impedance of the signal traces.

This is because the capacitance of the capacitor laminate is inversely proportional to the thickness of the laminate, while signal trace impedance is directly proportional to the thickness of the laminate. Consequently, the high capacitance of the capacitor laminate has a relatively small thickness to provide improved decoupling, but at the same time the small thickness of the capacitor laminate reduces the impedance of the signal traces to below desired impedance values.

The signal trace impedance is inversely proportional to the width of the trace, hence a common method of increasing the signal trace impedance to desired values when using the capacitor laminate is to reduce the width of the signal trace. Therefore, while using the capacitor laminate improves decoupling in a PCB, there is presently a consequent need to reduce the width of signal traces on the PCB to ensure the signal traces have the desired trace impedance values. The resultant difficulty then when using the capacitor laminate in a PCB is fabricating the relatively narrow traces that are required.

BRIEF SUMMARY OF THE INVENTION

The present invention seeks to provide a method for forming a printed circuit board and a printed circuit board formed thereby, which overcomes or at least reduces the abovementioned problems of the prior art Accordingly, in one aspect, the present invention provides a multi-layered substrate comprising:
  a dielectric layer having a substantially uniform dielectric constant, the dielectric layer having a first surface and a second surface, and the dielectric layer having thicker portions and thinner portions between the first and second surfaces;
  a first conductive layer on the first surface of the dielectric layer; and
  a second layer comprising a plurality of conductive pieces on the second surface of the dielectric layer,
  wherein a first of the plurality of conductive pieces, one of the thicker portions of the dielectric layer, and the first conductive layer form a first capacitor, and
  wherein a second of the plurality of conductive pieces, one of the thinner portions of the dielectric layer, and the first conductive layer form a second capacitor.

In another aspect, the present invention provides a printed circuit board comprising:
  at least one dielectric layer having at least a first portion with a first thickness and having at least a second portion with a second thickness, wherein the second thickness is different from the first thickness;
  at least a first pair of metallization layers having the at least the first portion therebetween forming a first capacitor with a first value.
  at least a second pair of metallization layers having the at least the second portion therebetween forming a second capacitor with a second value different from the first value.

In yet another aspect, the present invention provides a substrate comprising:
  a layer of dielectric material having a first surface and a second surface, wherein the second surface is opposite the first surface; and
  a plurality of conductive portions comprising:
    at least a first pair of the plurality of conductive portions,
      wherein one of the first pair of the plurality of conductive portions being disposed in the layer of dielectric material proximal to the first surface, wherein at least part of the one of the first pair of the plurality of conductive portions extending from the first surface towards the second surface, and wherein the other one of the first pair of the plurality of conductive portions being disposed proximal to the second surface and being spaced apart from the at least part of the one of the first pair of the plurality of conductive portions by a first distance; and at least a second pair of the plurality of conductive portions, wherein one of the second pair of the plurality of conductive portions being disposed in the layer of dielectric material proximal to the first surface, wherein at least part of the one of the second pair of the plurality of conductive portions extending from the first surface towards the second surface, and wherein the other one of the second pair of conductive portions being disposed proximal to the second surface and being spaced apart from the at least part of the one of the second pair of conductive portions by a second distance, wherein the first distance is greater than the second distance.

In still another aspect, the present invention provides a method for forming a multi-layered substrate comprising:

a) forming a plurality of sections, each of the plurality of sections comprising at least one substrate layer and at least one patterned layer of metallization, wherein the patterned layer of metallization has thicker portions and thinner portions;

b) stacking the plurality of sections with intervening layers of dielectric material;

c) forming the stack of the plurality of sections and the intervening layers of dielectric material into the multi-layered substrate.

BRIEF DESCRIPTION OF THE DRAWINGS

An embodiment of the present invention will now be fully described, by way of example, with reference to the drawings of which.

DETAIL DESCRIPTION OF THE DRAWINGS

The present invention, as described below, provides a dielectric layer in the PCB having varying thickness. Thinner portions of the dielectric layer form decoupling capacitors having a higher capacitance, and thicker portions form capacitors with lower capacitance for trace impedance values within a desired range. This separates the conflicting requirements of decoupling and trace impedance on the dielectric layer in a PCB making each less dependent on the other. Portions of metallization on power and ground planes are made thicker with portions of the dielectric layer between the portions of metallization being made thinner, to produce a higher capacitance for decoupling. Portions of metallization on the ground plane that are aligned with signal traces on a PCB are made thinner resulting in a thicker portion of the dielectric layer between the traces and the ground plane to produce a lower capacitance, advantageously allowing the traces to be made wider without adversely affecting the trace impedance.

Figure 1:
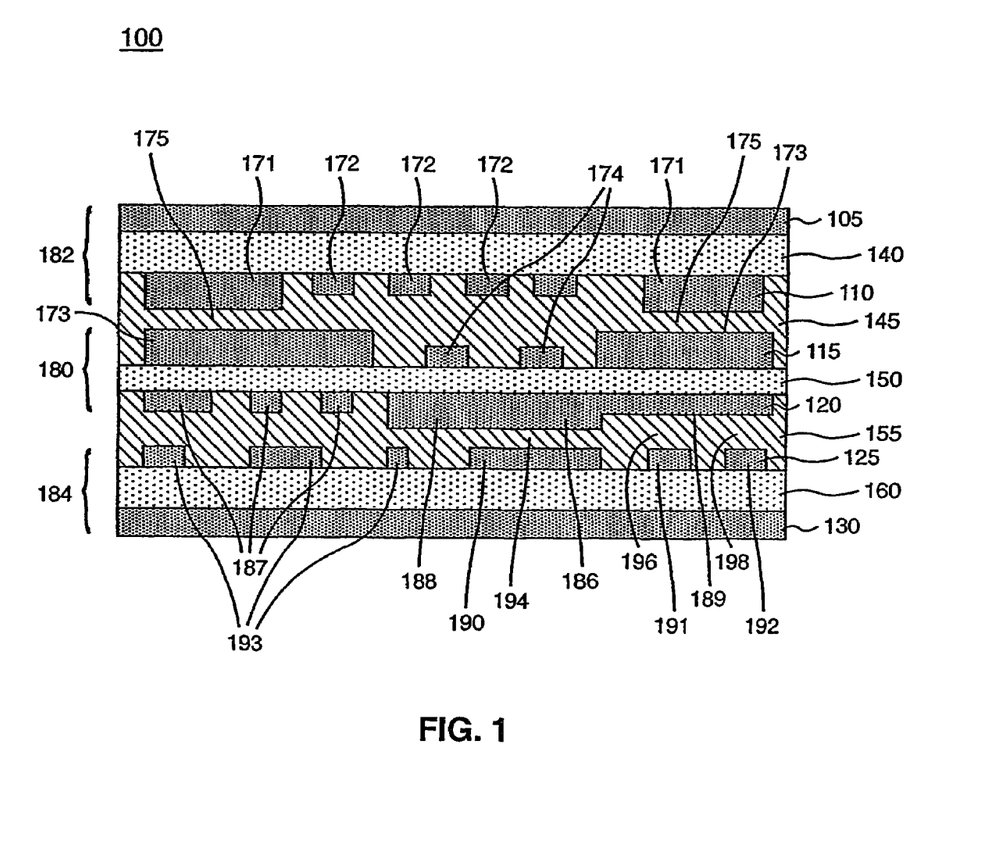
FIG. 1 shows a cross-sectional view of a printed circuit board in accordance with the present invention.

In FIG. 1, a six layered printed circuit board (PCB) 100 has six layers of metallization 105,110,115,120,125 and 130, and five intervening layers of electrically non-conductive material or insulation 140, 145, 150, 155 and 160. The layers of metallization 105,110,115, 120,125 and 130 are typically made of copper.

The patterned copper layer 105 provides copper interconnections or traces between the components that are mounted on the upper surface of the PCB 100, and is often referred to as the signal layer. Below the copper layer 105 is the layer 140 that is made of electrically insulating materials typically used in the fabrication of PCBS. These materials include epoxy glass FR4, ceramic, and ployimide. The layer 140 insulates the copper layer 105 from the next copper layer 110. The layer 110 is a patterned copper layer which provides the common electrical power plane having connections to electrical power. In addition, the layer 110 can provide interconnections in the form of traces for signals. For example, the layer 110 comprises thicker portions 171 that provide power, and thinner portions 172 that are signal traces.

The layer 145 is made of prepreg, such asFR4, Ceramic, Liquid Epoxy &Polyimide, from Nelco, Dupont, Taiyo & Gore with a dielectric constant of 2.5~10.0.

The next patterned copper layer 115 has thicker portions 173 and thinner portions 174, and is often referred to as the ground plane as it forms a common electrical ground in the PCB 100. The layer 115 can for example include the thinner portions 174 providing signal traces. The portions 171, associated portions 173, of the patterned copper layers, and portions 175 of the prepreg of layer145 between the portions 171 and 173, advantageously form distributed decoupling capacitance between the power plane 110 and the ground plane 115.

The layer 150 is a substrate made of electrically insulating material, and may be of similar material to that of the layer 140. The layer 150 together with the patterned copper layers 115 and 120 above and below the layer 150, form an inner section 180 of the PCB 100. Similarly, the layer of insulation 140, the patterned copper layer 105 and the patterned copper layer 110 form an upper section 182, and the layer of insulation 160, the patterned copper layer 130, and the patterned copper layer 125 form a lower section 184, of the PCB 100.

It will be appreciated that the upper and lower sections 182 and 184 are similar in constitution and function. In the lower section 184, the layer 130 is the outer plane, the layer 125 is the power plane and the layer 120 the ground plane.

With reference to the inner section 180, a portion 186 of the patterned copper layer 120 is a part of the ground plane which has a thicker part 188 and a thinner part 189. The thicker part 188 together with an associated portion 190 of the patterned copper layer 125, and a portion 194 of the prepreg layer 155, form decoupling capacitance. The thinner part 189 with associated portions 191 and 192 of the patterned copper layer 125 and portions 196 and 198 of the prepreg layer 155 form a lower capacitance, that results in trace impedance of traces 191 and 192 being within a desired impedance range.

Hence, the relatively smaller thickness of the portion 194 of the prepreg layer 155 between the thicker part 188 and the portion 190 advantageously ensures that the resultant high capacitance between the thicker part 188 and the portion 190 provides decoupling between the ground plane 120 and the power plane 125. In addition, the relatively larger thickness of portions 196 and 198 of the prepreg layer 155 between the thinner part 189 and the traces 191 and 192 produces relatively lower capacitance, advantageously allowing the traces 191 and 192 to be fabricated having relatively larger trace widths but with trace impedances within the desired trace impedance range.

Figure 2:
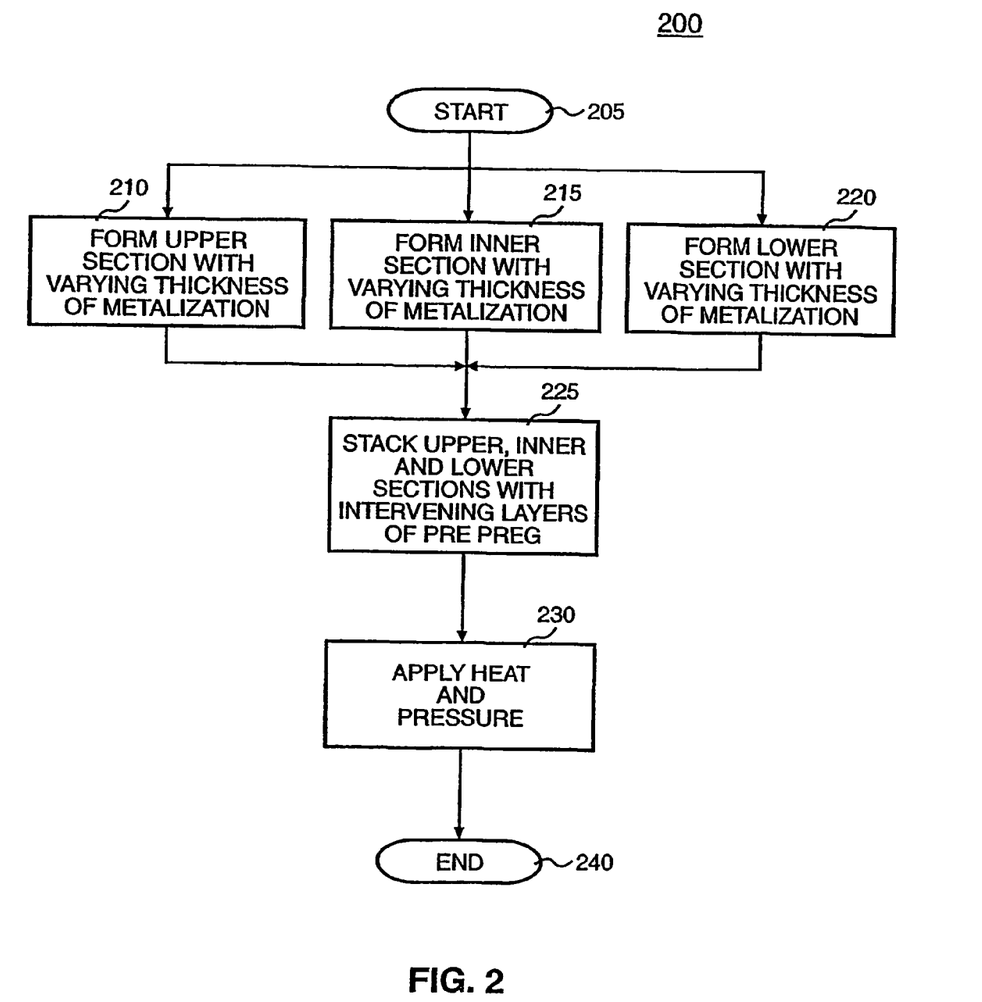
FIG. 2 shows a flowchart detailing a process for fabricating the PCB in FIG. 1.

With additional reference to FIG. 2 a process 200 for fabricating the PCB 100 starts 205 with three steps 210, 215 and 220 that are shown being performed concurrently, but can also be performed sequentially. The steps form 210, 215 and 220 form the upper 182, inner 180 and lower 184 sections, of the PCB 100, respectively. Forming 210, 215 and 220 the sections 182,180 and 184 involves processes that form the patterned layers of copper 105, 110, 115, 120, 125 and 130 on the substrate layers 140, 150 and 160, respectively.

On the inner section 180 the copper layers 115 and 120 are formed on the substrate layer 150, and on both the upper and lower sections 182 and 184, the copper layers 105 and 110, and 125 and 130, are formed on the substrate layers 140 and 160. In addition, forming the patterned layers of copper 105, 110, 115, 120, 125 and 130 includes forming the patterned layers of copper 110, 115, 120 and 125 with the thinner portions 172, 174, 187, 190, 191, 192, 193 and the part 189, and the thicker portions 171, 173 and the part 188. The process of forming the individual sections will be described in more detail later.

Figure 3:
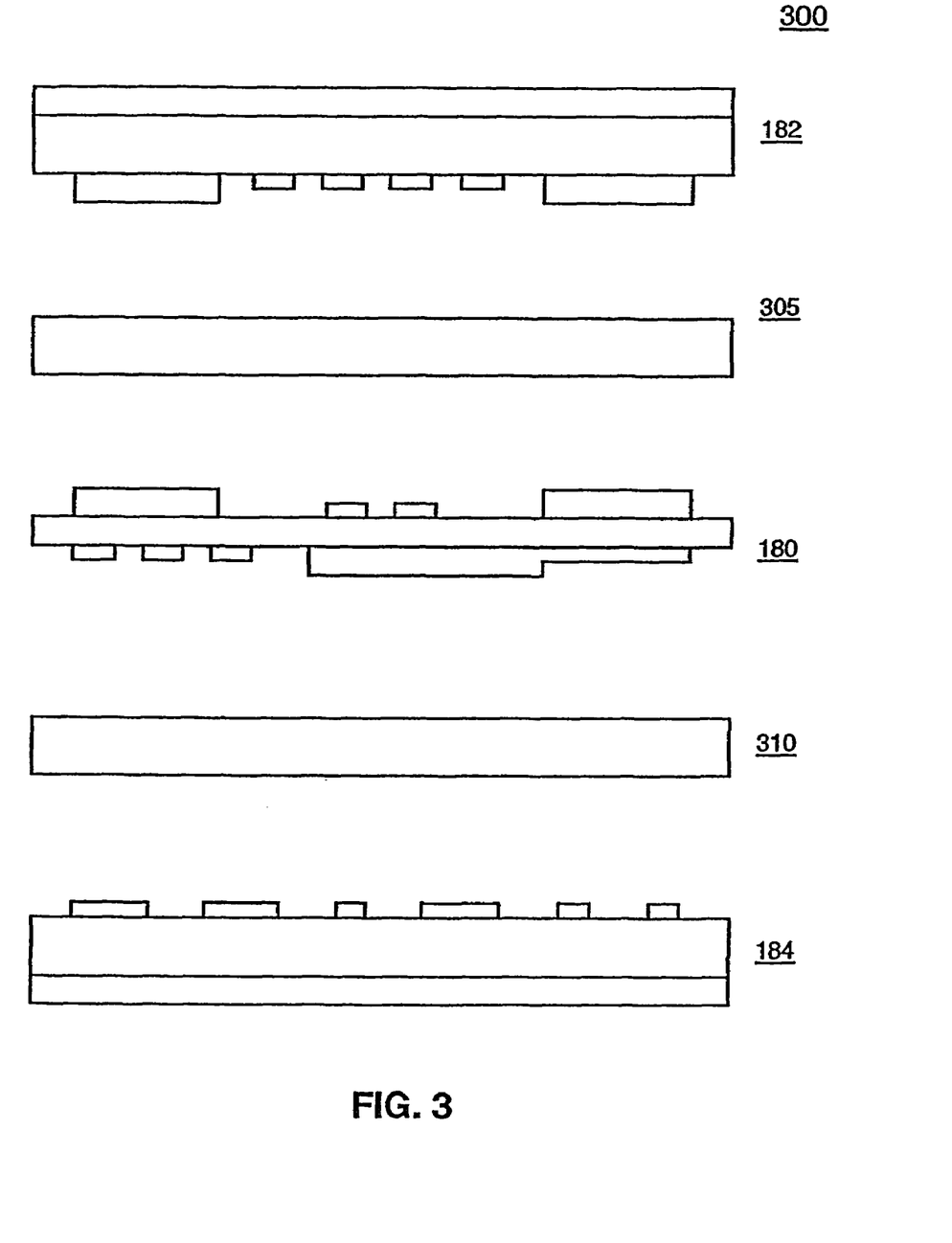
FIG. 3 shows a cross-sectional view of an arrangement of the sections the PCB in FIG. 1 in accordance with the process in FIG. 2.

Next, with additional reference to FIG. 3, the three sections 182, 180 and 184 are arranged 225 in a stack 300 with the two alternate layers of prepreg 305 and 310, and with the necessary alignment between the patterned layers of copper on the three sections 182, 180 and 184. Subsequently, the stack 300 of the sections 182, 180 and 184 and the layers of prepreg 305 and 310, is compressed under pressure 230, and the whole assembly is heated 230 to produce the PCB 100, ending 240 the process 200.

Figure 4:
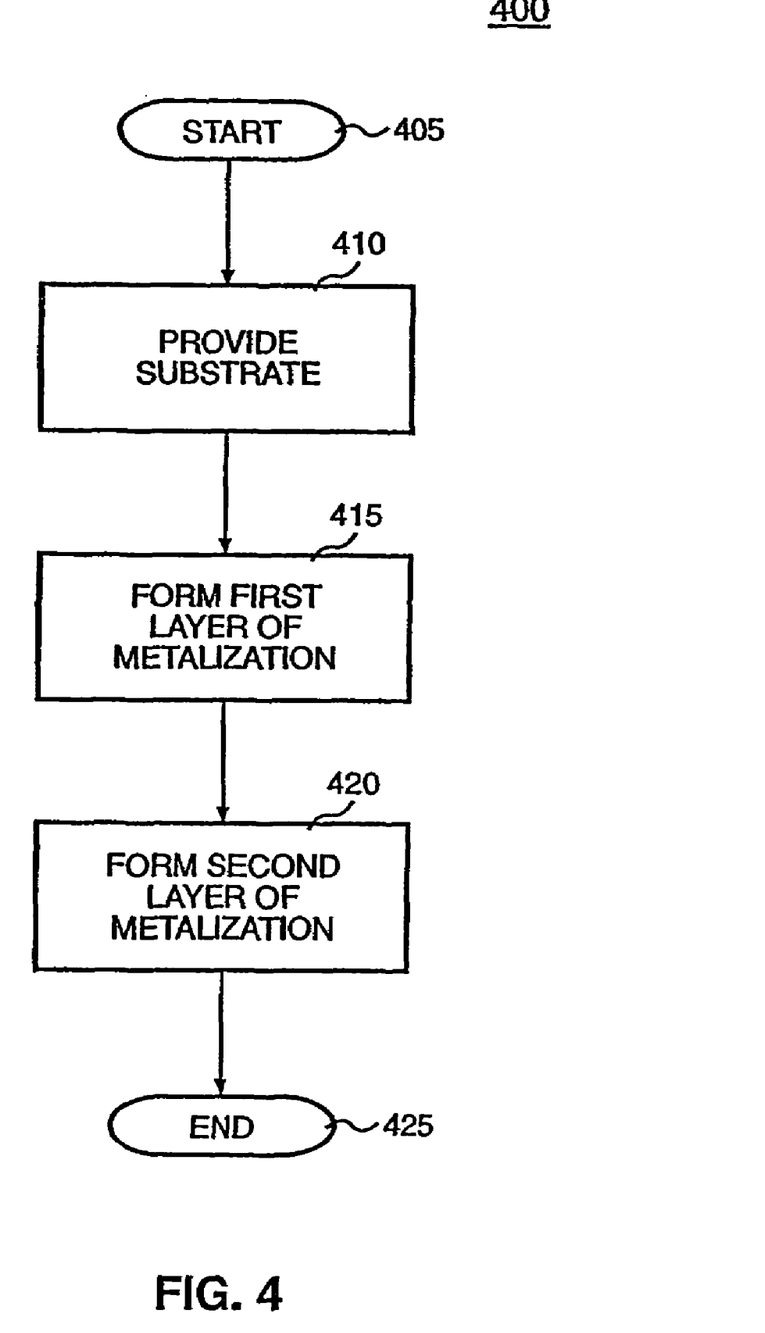
FIG. 4 shows a flowchart detailing a generic process for fabricating the sections of the PCB in FIG. 1.
Figure 5:
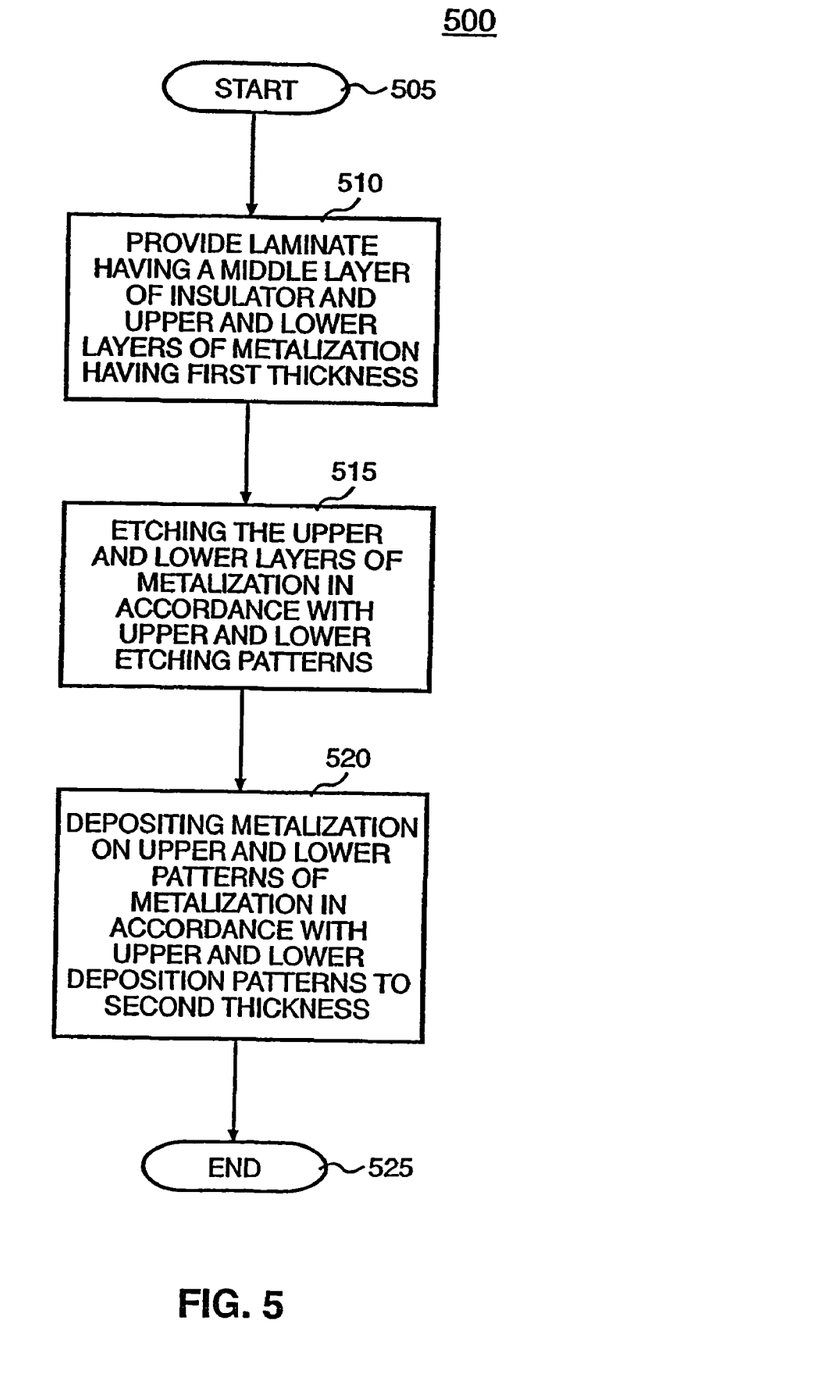
FIG. 5 shows a flowchart detailing a particular process for fabricating the sections of the PCB in FIG. 1.

With further reference now to FIG. 4, a generic process 400 of forming any one of the sections 182, 180 and 184 starts 405 with providing 410 a substrate. The substrate may be a bare substrate or a laminate comprising an insulating core sandwiched between two layers of copper.

A first layer of metallization is then formed 415 on the substrate in accordance with a first predetermined pattern.

When the substrate is a bare substrate, then a process of imaging using photolithography followed by electro-deposition can be used to form the first layer of copper. Alternatively, when the substrate is a laminate, a photolithographic process followed by an etching process is used to form the first layer of metallization. The photolithography, electro-deposition and etching processes would be understood to one skilled in the art and will not be elaborated herein.

Subsequently, a second layer of metallization is formed 420 in accordance with a second predetermined pattern, over the substrate and the first layer of metallization. Whether the first layer of metallization was formed by the deposition or the etching processes, the second layer of metallization is formed by the photolithography and the electro-deposition processes. The process 400 then ends 425.

With the process 400, the first layer of metallization is formed with a predetermined thickness, and the second layer of metallization is formed on portions of the first layer of metallization in accordance with the first and second predetermined patterns. In this way, selected portions of the resulting layers of metallization have a larger thickness relative to other non-selected portions.

With due regard to the practical constraints of materials that are available from material suppliers, and the processes commonly employed in PCB manufacturing facilities, an alternative process for fabricating the sections 182, 180 and 184, now follows.

Referring now to FIGS. 5, 6A–C, 7A–C, 8A–B, a process 500 for making the inner, upper and lower sections 182, 180 and 184 starts 505 with providing a laminate 600, 700 and 800 which have a middle layer of insulation 150, 140, and 160, sandwiched between two layers of unpatterned copper layers, 605 and 610, 105 and 705, and 805 and 130, respectively. This is followed by photolithographic imaging and etching 515 to form one or both of the layers of copper on the substrate, in accordance with a first predetermined pattern. Of course, the first predetermined pattern of copper has a first uniform thickness which is equal to the original thickness of the copper layers. The photolithographic and etching processes simply removes the portions of the copper layers that are not required.

On the laminate 600, the copper layer 605 is etched to leave portions 614, 174, and 612, and the copper layer 610 is etched to leave portions 187 and 186 with part 189, thus producing etched laminate 601. On laminate 700, the copper layer 705 is etched to form portions 710 and 172, thus producing etched laminate 701. And, on laminate 800, the copper layer 805 is etched to form portions 190, 191, 192 and 193, to produce the lower section 184.

Figure 6A:
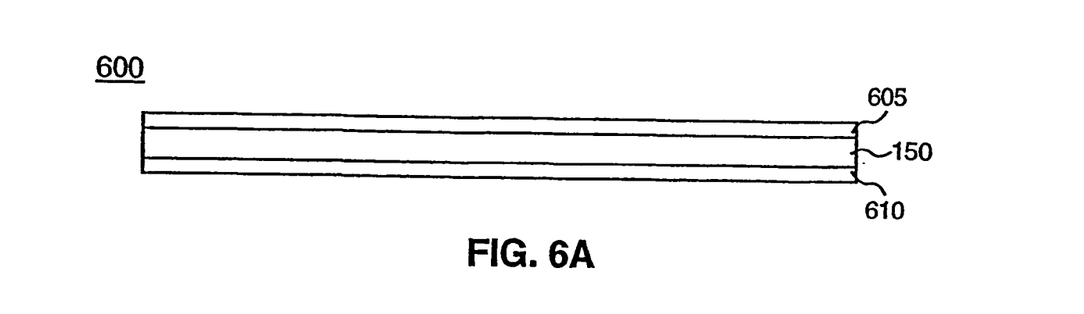
FIGS. 6A–C show cross-sectional views of the formation of an inner section of the PCB in FIG. 1 in accordance with the process in FIG. 5.
Figure 6B:
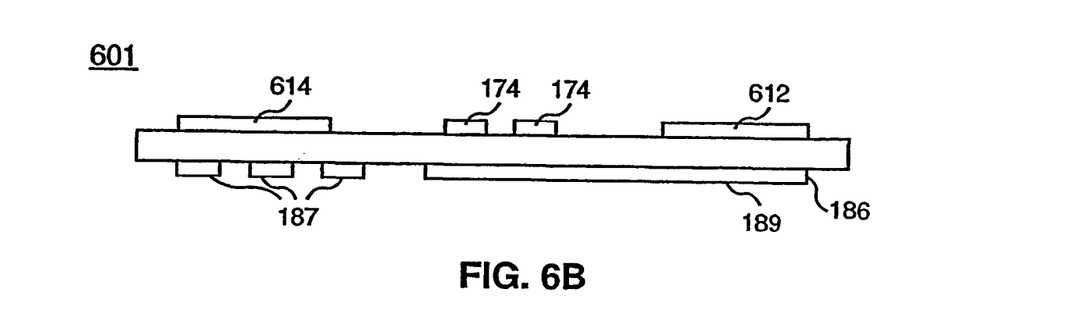
Figure 6C:
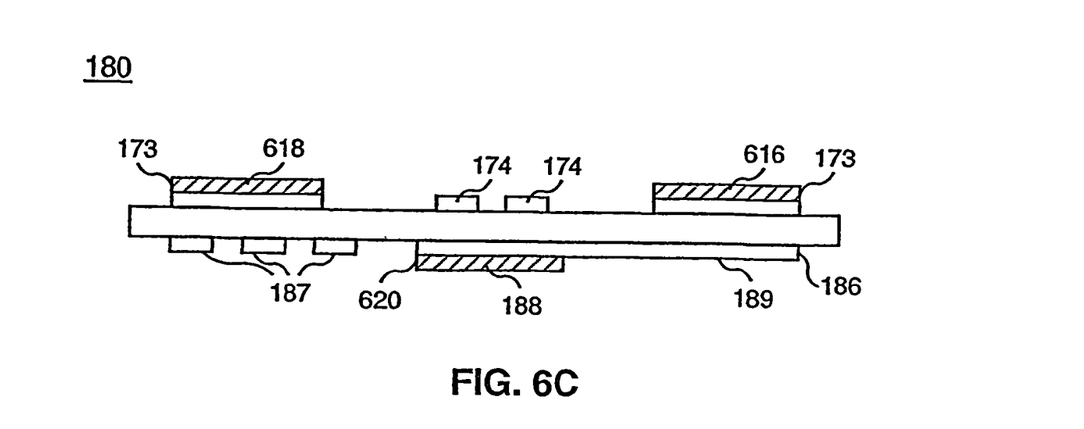
Figure 7A:
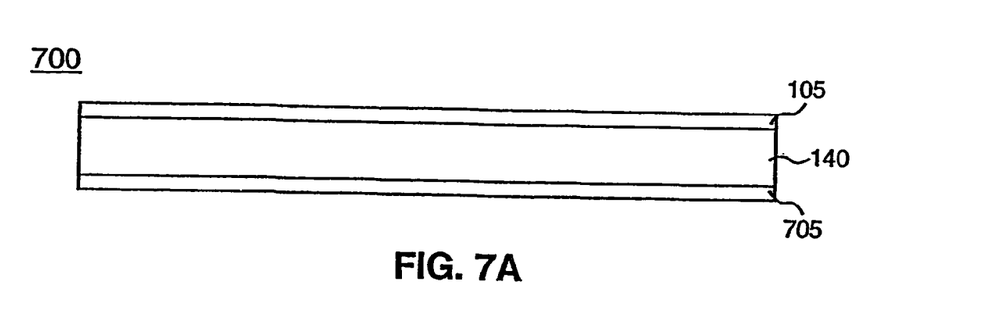
FIGS. 7A–C show cross-sectional views of the formation of an upper section of the PCB in FIG. 1 in accordance with the process in FIG. 5.
Figure 7B:
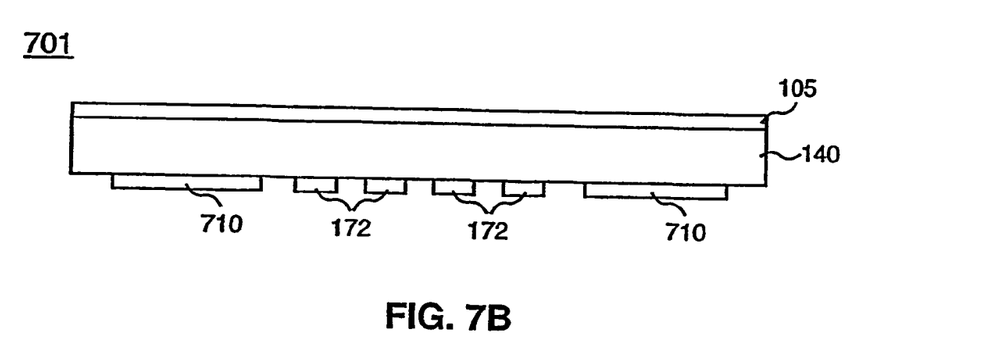
Figure 7C:
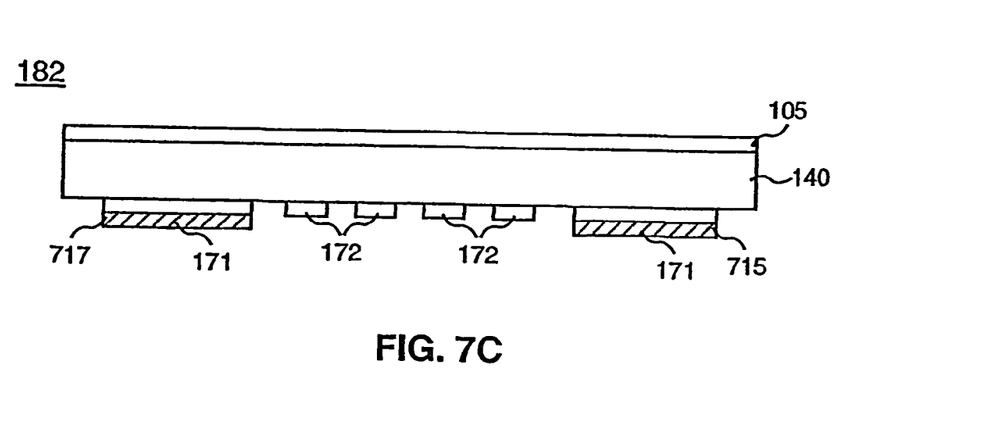
Figure 8A:
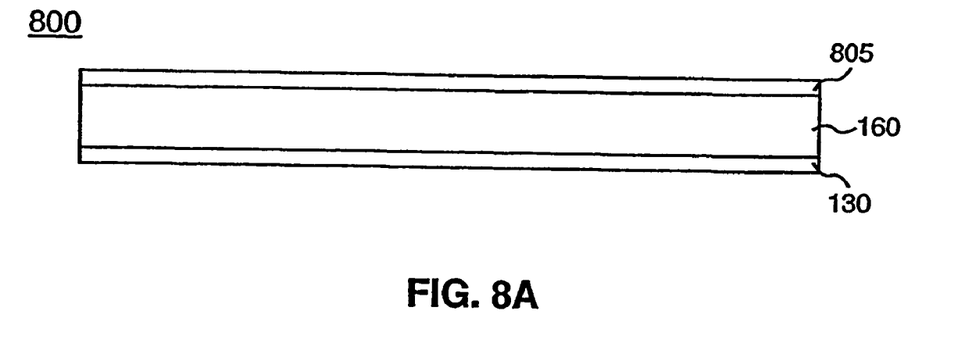
FIGS. 8A–B show cross-sectional views of the formation of a lower section of the PCB in FIG. 1 in accordance with the process in FIG. 5.
Figure 8B:
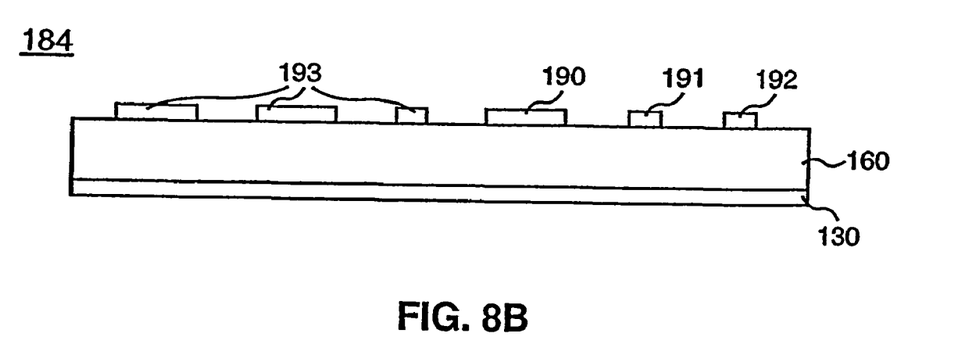

Subsequently, after imaging with a second photolithographic process, in accordance with a second predetermined pattern, an electro-deposition process 520 builds up thicker portions on some of the portions of the first layer of metallization. The etched laminate 601 has copper layers 616, 618 and 620 deposited thereon to form the inner section 182. Similarly, the etched laminate 701 has copper layers 715 and 717 deposited thereon to form the upper section 182. As indicated earlier, after etching, the laminate 800 becomes the lower section 184 as it does not require thicker portions to be formed thereon.

Returning briefly to FIG. 4, if in the process 400, the substrate provided in step 410 has a layer of metallization of sufficient thickness to form the thicker conductive portions, an alternative process 900 for fabricating the inner, upper and lower sections 180, 182 and 184 can be employed, and will now be described.

With reference to FIGS. 9 and 10A–C the process 900 will now be described for making the inner section 180, however, the process can be used to make the upper and lower sections 182 and 184, as will be appreciated by one skilled in the art based on the description that follows, without significant variation.

Figure 9:
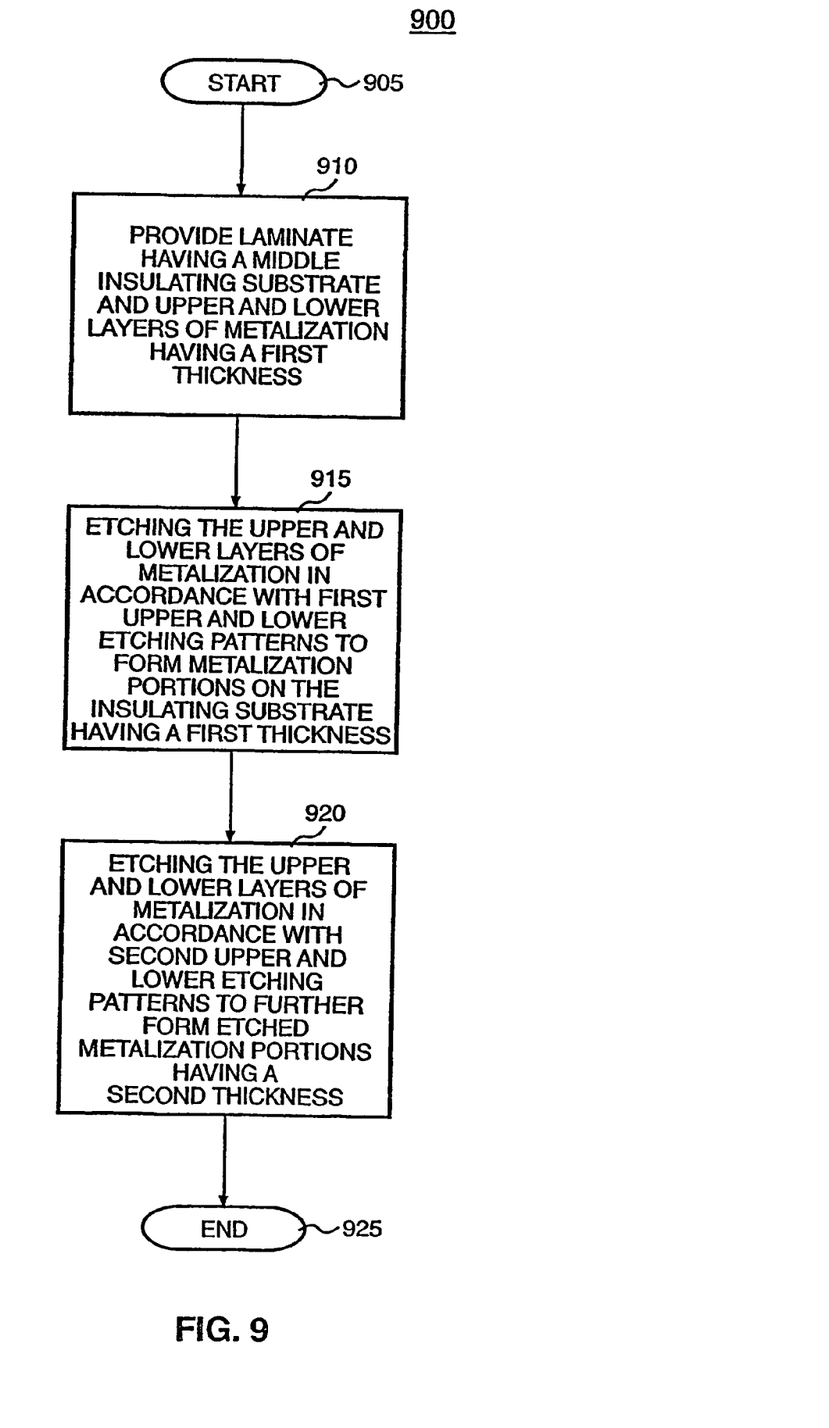
FIG. 9 shows a flow chart detailing a process for fabricating sections of the PCB in FIG. 1.
Figure 10A:
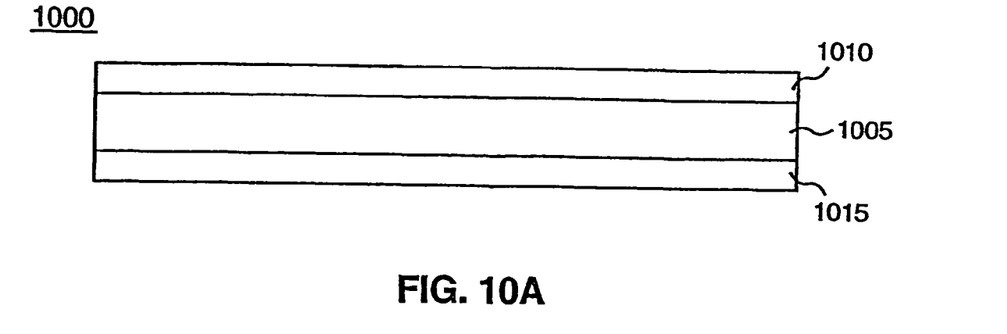
FIGS. 10A–C shows cross-sectional views of the formation of the inner section of the PCB in FIG. 1 in accordance with the process in 5 FIG. 9.
Figure 10B:
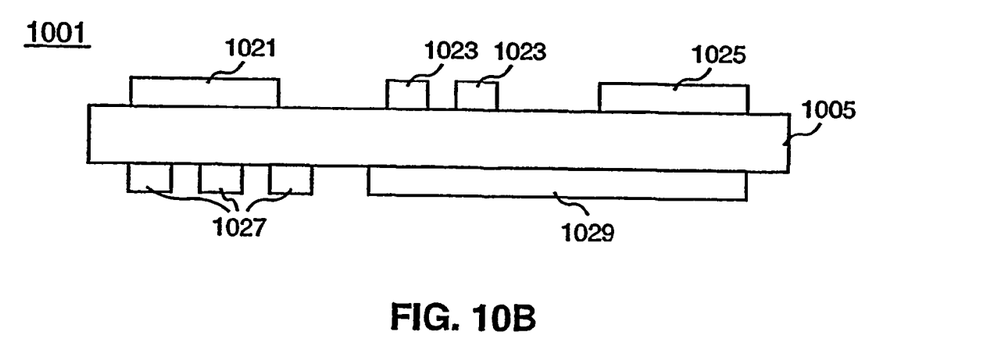

The process 900 starts 905 with providing 910 a laminate 1000 having a middle substrate layer 1005 and upper and lower layers of copper 1010 and 1020. Using the processes of photolithography and etching, the copper layers 1010 and 1020 are etched 915 in accordance with a first predetermined pattern to leave portions 1021, 1023, 1025, 1027 and 1029, all having a first thickness, on the substrate 1005, thus producing etched substrate 1001.

Figure 10C:
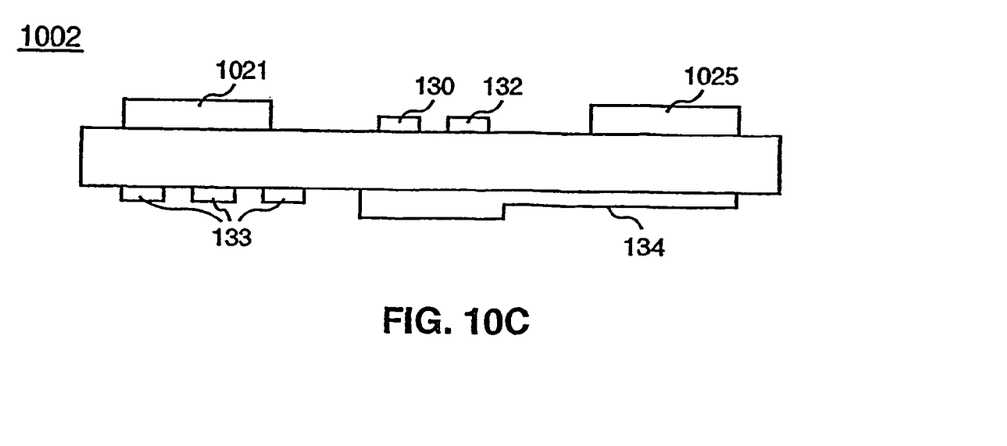

Subsequently, the processes of photolithography and etching are applied a second time to the etched substrate 1001 to etch 920 the portions 1023, 1027 and part of 1029, which produces substrate 1002 having portions 130, 132, 133 and 134 with a second thickness that is less than the first thickness. After the second etching 920, the process 900 ends 925. Note that the resultant etched substrate 1002 is identical to the inner section 180.

Alternatively, with reference to FIGS. 9 and 11A–C, the two step etching process 900 using a different set of first and second etching patterns can be used to produce the inner section 180, and as will be understood by one skilled in the art, is also applicable to the formation of the upper and lower sections 182 and 184 without significant variation.

Figure 11A:
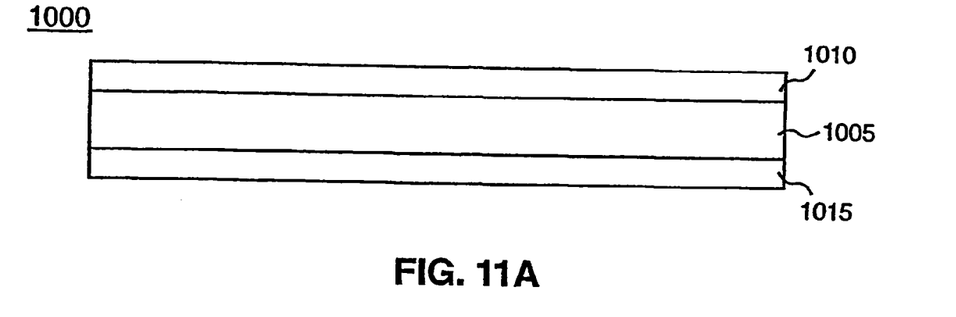
FIGS. 11A–C shows cross-sectional views of the formation of the inner section of the PCB in FIG. 1 in accordance with the process in FIG. 9.
Figure 11B:
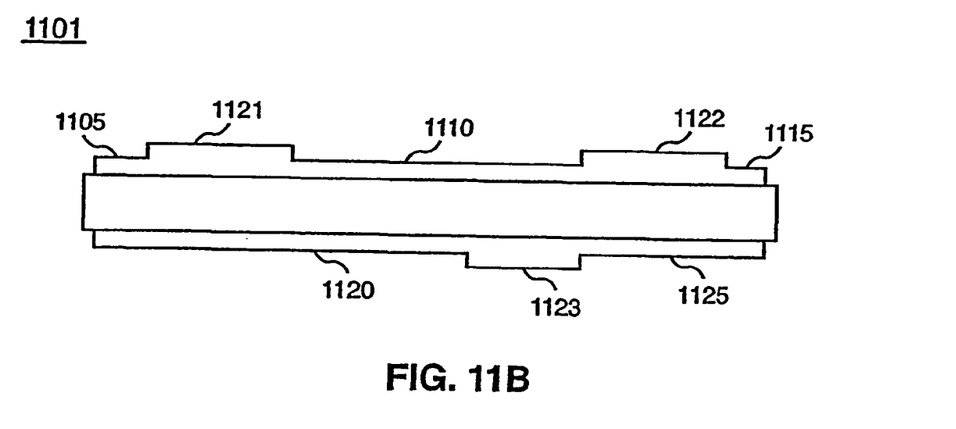
Figure 11C:
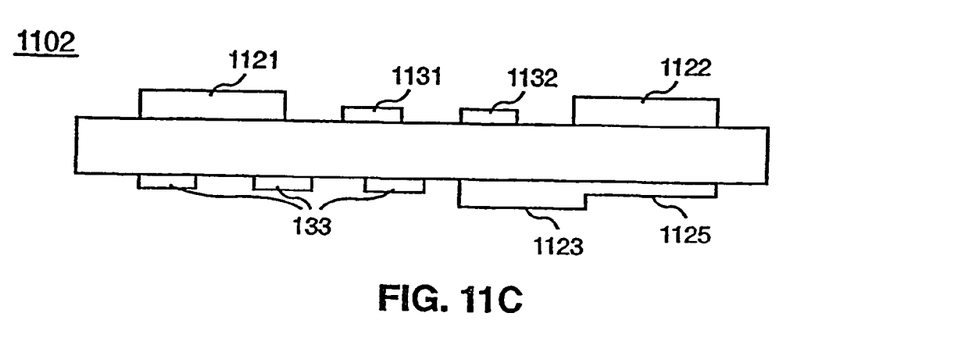
Figure 12:
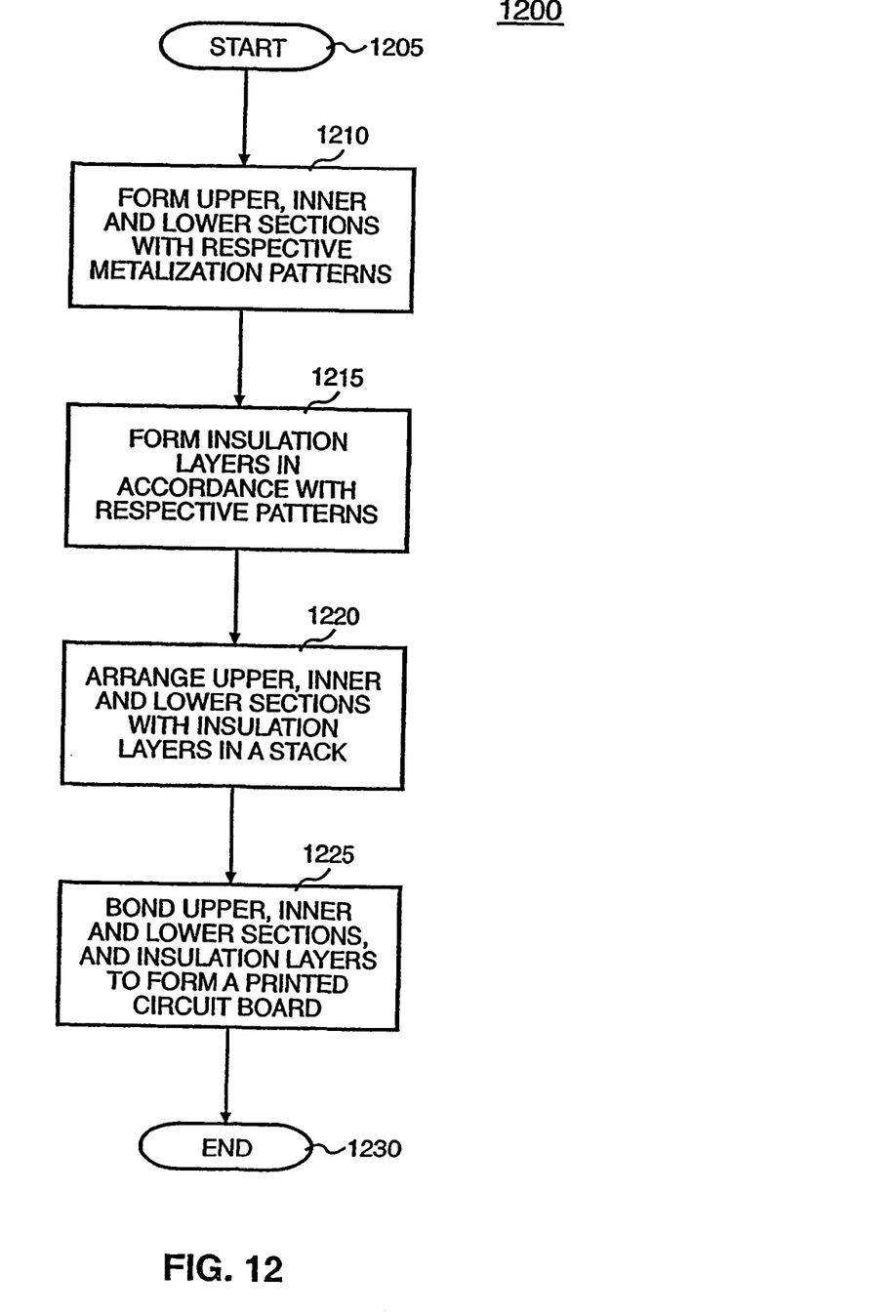
FIG. 12 shows a flowchart detailing another process for fabricating the PCB in FIG. 1.
Figure 13A:
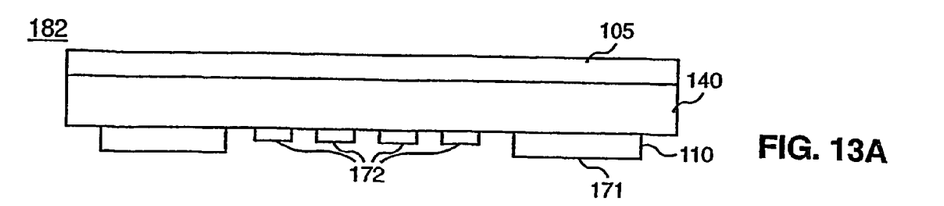
FIG. 13 shows cross-sectional views of the formation of the PCB in FIG. 1 in accordance with the process in FIG. 12.
Figure 13B:
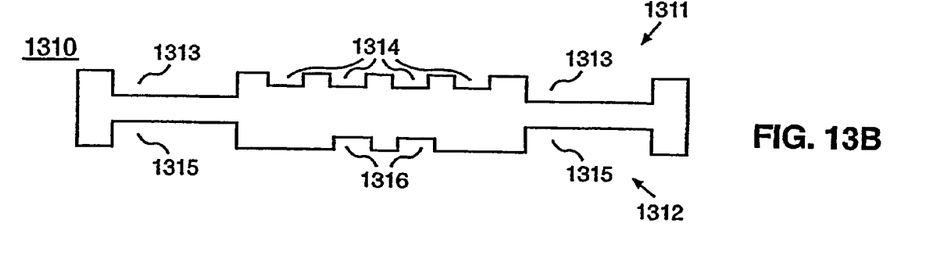
Figure 13C:
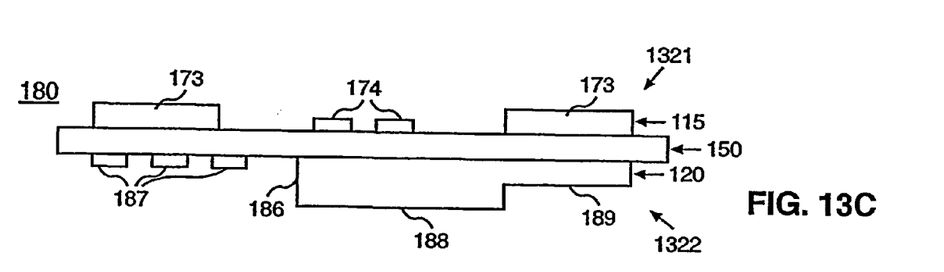
Figure 13D:
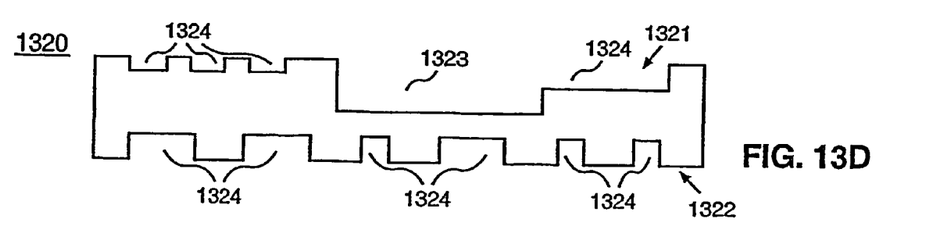
Figure 13E:
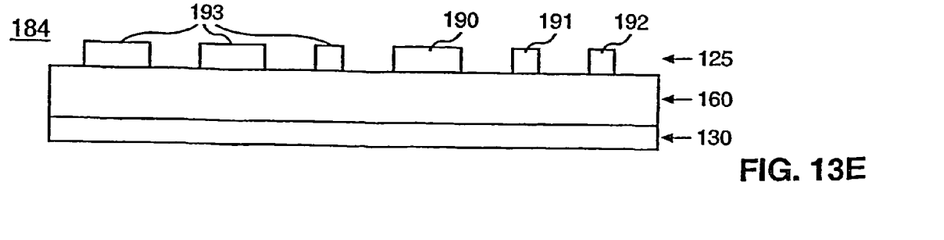

As before, the process 900 starts with providing the laminate 1000 having a middle substrate layer 1005 and upper and lower layers of copper 1010 and 1020. Then using the processes of photolithography and etching, the copper layers 1010 and 1020 are etched 910 in accordance with an alternative first predetermined pattern to leave portions 1121, 1122 and 1123 unaffected by etching, and having the original first thickness of the copper layers 1010 and 1015. The etching 910 etches away parts of the copper layers 1010 and 1015 to leave portions 1105, 1110, 1115, 1120 and 1125 having a second thickness which is less than the first thickness. This produces an etched laminate 1101 which is subsequently etched 920 a second time in accordance with an alternative second predetermined pattern. The second etching produces the etched laminate 1102 having thicker copper portions, i.e. the first thickness, 1121, 1122 and 1123, and thinner copper portions, i.e. the second thickness, 1131, 1132, 1133 and part 1125. As a result, the etched laminate 1102 is identical to the inner section 180.

Referring now to FIGS. 12 and 13A–E, an alternative process for forming the PCB 100 starts 1205 with forming 1210 the inner, upper and lower sections 180, 182 and 184. Any of the processes 500 or 900, as described earlier can be used to form the sections inner, upper and lower sections 180, 182 and 184. Next, insulating layers 1310 and 1320 are formed 1215 having contoured surfaces 1311 and 1312, and 1321 and 1322, respectively. The insulating layers 1310 and 1320 can be made of preformed prepreg which may be fabricated with a molding process. Such molding processes include injection and/transfer molding as will be known to one skilled in the art.

Alternatively, the insulating layers 1310 and 1320 can be formed of any suitable dielectric material and appropriate adhesive or bonding agents employed to bind 1225 the insulating layers 1310 and 1320 and the sections 180, 182 and 184 together, under imposed heat and pressure.

The insulating layers 1310 and 1320 can be formed using the same processes. Taking the insulating layer 1310, as an example, the contoured surface 1311 is formed having deeper contoured portions 1313 and shallower contoured portions 1314, and the contoured surface 1312 is formed having deeper contoured portions 1315 and shallower contoured portions 1316. The contoured portions 1313 and 1314 complement the portions 171 and 172 on the patterned layer of metallization 110, such that the contoured portions 1313 and 1314 fit with the portions 171 and 172 on the patterned layer of metallization 110.

Similarly, the contours 1315 and 1316 complement the portions 173 and 174 on the patterned layer of metallization 115, and the same fitting applies for the insulation layer 1320 and the patterned layers of metallization 120 and 125.

As the layers of insulation 1310 and 1320 are preformed before assembly, the thickness at various portions of the layers of insulation 1310 and 1320 are predetermined. As the thickness of the layer of insulation determines the capacitance, the predetermined thickness at various portions of the layer of insulation advantageously determines the capacitance at the desired portions of the completed PCB.

The present invention, as described, provides a capacitive printed circuit board having more easily manufactured wider traces that have required trace impedance.

This is accomplished by a dielectric layer in a PCB having thicker portions that form decoupling capacitors between power and ground planes, and thinner portions that form capacitors having a lower capacitance that provide desired trace impedance for signal traces in the PCB.

The present invention therefore provides a method for forming a printed circuit board and a printed circuit board formed thereby, which overcomes or at least reduces the abovementioned problems of the prior art.

It will be appreciated that although only one particular embodiment of the invention has been described in detail, various modifications and improvements can be made by a person skilled in the art without departing from the scope of the present invention.

What is claimed is:

1. A multi-layered substrate comprising:
   a dielectric layer having a substantially uniform dielectric constant, the dielectric layer having a first surface and a second surface, and the dielectric layer having thicker portions and thinner portions between the first and second surfaces;
   a first conductive layer on the first surface of the dielectric layer; and
   a second layer comprising a plurality of conductive pieces on the second surface of the dielectric layer,
   wherein a first of the plurality of conductive pieces, one of the thicker portions of the dielectric layer, and the first conductive layer form a first capacitor with lower capacitance, and
   wherein a second of the plurality of conductive pieces, one of the thinner portions of the dielectric layer, and the first conductive layer form a second capacitor with higher capacitance.

2. A multi-layered substrate in accordance with claim 1 wherein the first conductive layer comprises a plurality of conductive pieces,
   wherein the first of the plurality of conductive pieces of the second layer, the one of the thicker portions of the dielectric layer, and a first of the plurality of conductive pieces of the first conductive layer form the first capacitor, and
   wherein the second of the plurality of conductive pieces of the second layer, the one of the thinner portions of the dielectric layer, and a second of the plurality of conductive pieces of the first conductive layer form the second capacitor.

3. A multi-layered substrate in accordance with claim 2 wherein the first of the plurality of conductive pieces of the second layer, the one of the thicker portions of the dielectric layer, and the first of the plurality of conductive pieces of the first conductive layer are substantially aligned along a first common axis extending between the first conductive layer and the second layer.

4. A multi-layered substrate in accordance with claim 2 wherein the second of the plurality of conductive pieces of the second layer, the one of the thinner portions of the dielectric layer, and the second of the plurality of conductive pieces of the first conductive layer are substantially aligned along a second common axis extending between the first conductive layer and the second layer.

5. A multi-layered substrate in accordance with claim 2 wherein the first and second of the plurality of conductive pieces of the first conductive layer have substantially unequal thickness extending from a first common plane.

6. A multi-layered substrate in accordance with claim 2 wherein the first and second of the plurality of conductive pieces of the first conductive layer have substantially equal thickness extending from a first common plane.

7. A multi-layered substrate in accordance with claim 2 wherein the first and second of the plurality of conductive pieces of the second layer have substantially equal thickness extending from a common plane.

8. A multi-layered substrate in accordance with claim 2 wherein the first and second of the plurality of conductive pieces of the second layer have substantially unequal thickness extending from a common plane.

9. A printed circuit board comprising:
at least one dielectric layer having at least a first portion with a first thickness and having at least a second portion wit a second thickness, wherein the second thickness is different from the first thickness;
at least a first pair of metallization layers having the at least the first portion therebetween forming a first capacitor with a first value;
at least a second pair of metallization layers having the at least the second portion therebetween forming a second capacitor with a second value different from the first value.

10. A printed circuit board in accordance with claim 9 wherein the at least one dielectric layer comprises a contoured dielectric layer having a range of thickness including the first thickness and the second thickness to provide a range of capacitor values.

11. A printed circuit board in accordance with claim 9, wherein at least one of each of the first and second pairs of metallization layers are substantially aligned with a horizontal plane.

12. A substrate comprising:
a layer of dielectric material having a first surface and a second surface, wherein the second surface is opposite the first surface; and
a plurality of conductive portions comprising:
at least a first pair of the plurality of conductive portions,
wherein one of the first pair of the plurality of conductive portions being disposed in the layer of dielectric material proximal to the first surface, wherein at least part of the one of the first pair of the plurality of conductive portions extending from the first surface towards the second surface, and
wherein the other one of the first pair of the plurality of conductive portions being disposed proximal to the second surface and being spaced apart from the at least part of the one of the first pair of the plurality of conductive portions by a first distance; and
at least a second pair of the plurality of conductive portions,
wherein one of the second pair of the plurality of conductive portions being disposed in the layer of dielectric material proximal to the first surface, wherein at least part of the one of the second pair of the plurality of conductive portions extending from the first surface towards the second surface, and
wherein the other one of the second pair of conductive portions being disposed proximal to the second surface and being spaced apart from the at least part of the one of the second pair of conductive portions by a second distance, wherein the first distance is greater than the second distance.

* * * * *